US010412274B2

(12) United States Patent
Adachi (10) Patent No.: US 10,412,274 B2
(45) Date of Patent: Sep. 10, 2019

(54) IMAGING UNIT, VEHICLE CONTROL UNIT AND HEAT TRANSFER METHOD FOR IMAGING UNIT

(71) Applicant: Masashi Adachi, Kanagawa (JP)

(72) Inventor: Masashi Adachi, Kanagawa (JP)

(73) Assignee: RICOH COMPANY, LTD., Tokyo (JP)

(*) Notice: Subject to any disclaimer, the term of this patent is extended or adjusted under 35 U.S.C. 154(b) by 228 days.

(21) Appl. No.: 15/070,319

(22) Filed: Mar. 15, 2016

(65) Prior Publication Data

US 2016/0277647 A1    Sep. 22, 2016

(30) Foreign Application Priority Data

Mar. 18, 2015   (JP) ................... 2015-055180
Dec. 10, 2015   (JP) ................... 2015-240799

(51) Int. Cl.

| | |
|---|---|
| *G03B 17/02* | (2006.01) |
| *B60R 11/04* | (2006.01) |
| *H04N 13/239* | (2018.01) |
| *H04N 5/225* | (2006.01) |
| *G03B 35/00* | (2006.01) |
| *G05D 1/02* | (2006.01) |

(Continued)

(52) U.S. Cl.
CPC .......... *H04N 5/2252* (2013.01); *B60R 11/04* (2013.01); *G03B 17/02* (2013.01); *G03B 17/55* (2013.01); *G03B 35/00* (2013.01); *G05D 1/0231* (2013.01); *G06K 9/00805* (2013.01); *H04N 13/239* (2018.05); *H05K 7/20336* (2013.01); *H05K 7/20881* (2013.01)

(58) Field of Classification Search
CPC .. H04N 5/2252; H04N 13/0239; B60R 11/04; G03B 17/02; G03B 17/55; G03B 35/00; G05D 1/0231; G06K 9/00805; H05K 7/20336; H05K 7/20881
USPC ......................................................... 348/148
See application file for complete search history.

(56) References Cited

U.S. PATENT DOCUMENTS 6,811,330 B1   11/2004 Tozawa
2006/0018509 A1   1/2006 Miyoshi et al.
(Continued)

FOREIGN PATENT DOCUMENTS

EP   1 086 859 A1   3/2001
JP   11-301365 A   11/1999
(Continued)

OTHER PUBLICATIONS

Extended European Search Report dated Jul. 22, 2016 in Patent Application No. 16161088.6.

*Primary Examiner* — William C Vaughn, Jr.
*Assistant Examiner* — Jae N Noh
(74) *Attorney, Agent, or Firm* — Oblon, McClelland, Maier & Neustadt, L.L.P.

(57) ABSTRACT

An imaging unit includes two imaging devices, a substrate holder that holds a circuit substrate on which a component regarding operation of the two imaging devices is disposed, and a heat transfer device that transfers heat generated in the component to the substrate holder. One end of the heat transfer device is brought in contact with the component and other end of the heat transfer device is brought in contact with the substrate holder on a line having an equal distance from each of image pick-up devices of the two imaging devices.

11 Claims, 6 Drawing Sheets

(51) Int. Cl.
*G06K 9/00* (2006.01)
*H05K 7/20* (2006.01)
*G03B 17/55* (2006.01)

(56) References Cited

U.S. PATENT DOCUMENTS

| | | |
|---|---|---|
| 2007/0097249 A1 | 5/2007 | Korenaga |
| 2008/0001727 A1 | 1/2008 | Ohsumi et al. |
| 2014/0132739 A1 | 5/2014 | Ohsumi et al. |
| 2014/0168507 A1* | 6/2014 | Renaud ............... H04N 5/2253 |
| | | 348/373 |
| 2014/0267621 A1 | 9/2014 | Takahashi |
| 2016/0006911 A1 | 1/2016 | Kimura et al. |
| 2016/0129839 A1* | 5/2016 | Kim ..................... H04N 5/2254 |
| | | 348/148 |
| 2016/0227078 A1* | 8/2016 | Oh ......................... B60R 11/04 |

FOREIGN PATENT DOCUMENTS

| | | |
|---|---|---|
| JP | 3877475 | 11/2006 |
| JP | 4691508 | 2/2011 |
| JP | 2012-189324 | 10/2012 |
| JP | 2013-127598 A | 6/2013 |
| JP | 2014-204383 | 10/2014 |
| JP | 2016-14564 | 1/2016 |

* cited by examiner

IMAGING UNIT, VEHICLE CONTROL UNIT AND HEAT TRANSFER METHOD FOR IMAGING UNIT

CROSS-REFERENCE TO RELATED APPLICATIONS

This application is based upon and claims the benefit of priority to each of Japanese Patent Application Nos. 2015-055180, filed on Mar. 18, 2015 and 2015-240799, filed on Dec. 10, 2015, the entire disclosures of which are incorporated herein by reference.

BACKGROUND

Technical Field

The present invention relates to an imaging unit capable of calculating a distance to a subject by imaging a three-dimensional image, a vehicle control unit using the imaging unit, and a heat transfer method for the imaging unit.

Description of Related Art

A so-called stereo camera is known as an imaging unit capable of calculating a distance to a target object, as eyes of a person. The stereo camera includes two monocular cameras. For example, the stereo camera is inter-connected with a vehicle control unit that controls a vehicle and configured to calculate a distance to a subject in front of the vehicle. As a result, the stereo camera can control operation of the vehicle depending on the calculated distance.

The two molecular cameras of the stereo camera are disposed on the same plane and fixed such that both optical axes of the cameras are parallel to each other. The stereo camera detects a parallax quantity of the subject by simultaneously imaging the same subject by the two molecular cameras and can calculate a distance to the subject based on the parallax quantity.

There is a plurality of important factors to calculate a distance by use of the stereo camera. It is important that a standard length which corresponds to a distance between the optical axes of the two monocular cameras is set to a predetermined value, and focal lengths of the two monocular cameras are configured to match with each other. Furthermore, it is also important that the optical axes of the two monocular cameras are maintained parallel. If one monocular camera is directed to a different direction from the other, the optical axes are not maintained parallel to each other. In such a state, the parallax quantity cannot be exactly detected. If the parallax quantity cannot be exactly detected, the distance to the subject cannot be exactly calculated, accordingly.

Therefore, it is important that the stereo camera has the same focal length so as to fit characteristics of lenses used for the two monocular cameras and the standard length continues to be maintained to have a designed value, so that the stereo camera calculates an exact distance. Moreover, it is important that parallelism of the optical axes of the two monocular cameras is set in a correct state at the time of assembling them and maintained in that state thereafter.

However, the important factors as described above are often changed depending on a sequential change in situation in installation environment of the stereo camera. That is to say, by the sequential change, a fixed portion of each monocular camera is deformed to become a state where directions (positions) of the monocular cameras differ from each other. Therefore, the parallelism of the optical axes is not maintained, or performance of each monocular camera is reduced by a change in temperature environment.

Therefore, a method of mounting a vehicle-mounted camera to hold a position of two monocular cameras is known (for example, see Japanese Patent No. 3877475). In the method, the two monocular cameras are fixed to both ends of one stay, and a center of the stay is fixed to a vehicle and so on. With this configuration, even if the stay is deformed by the influence of outside air temperature, the position of the two monocular cameras is held in a correct state.

As shown in the vehicle-mounted camera disclosed in Japanese Patent No. 3877475, it is needed to fix the vehicle-mounted cameras, that is, the monocular cameras to direct in front of the vehicle to measure a distance to a target object. The monocular cameras easily receive direct sunlight and are fixed to a position where a temperature easily becomes high. Each of the monocular cameras has heat-generating components in Large-Scale Integration (LSI) for processing an image. Therefore, temperature rise of the cameras occurs due to the heat from the heat-generating components. There is a possibility that the stay to fix the cameras is deformed by the temperature rise. Here, if the transfer of the heat from the heat-generating components of heat sources is not even over the entirety of the stay, there is a possibility that a fixed state of the stay and the cameras is deformed by thermal expansion due to the uneven heat distribution.

In particular, in the stay made of a metal as shown in the vehicle-mounted camera disclosed in Japanese Patent No. 3877475, if the heat distribution is uneven, the thermal expansion becomes uneven, and hence the stay is easily deformed. Because the vehicle-mounted camera is a stereo camera including the two monocular cameras, if the stay is unevenly deformed by the uneven thermal expansion, there is a possibility that the fixed state of only one of the monocular cameras is changed. As a result, the parallelism of the optical axes of the monocular cameras is not exactly maintained, or only one of the monocular cameras is heated and the characteristics of the monocular cameras decline. Thereby, the accuracy of the calculation of the distance is reduced.

SUMMARY

The present invention is made in view of the above and an object of the present invention is to provide an imaging unit capable of eliminating the occurrence of operation failure by the deviation of heat distribution in a stereo camera.

To accomplish the above object, an imaging unit according to one embodiment of the present invention includes two imaging devices, a substrate holder that holds a circuit substrate on which a component regarding operation of the two imaging devices is disposed, and a heat transfer device that transfers heat generated in the component to the substrate holder. One end of the heat transfer device is brought in contact with the component and other end of the heat transfer device is brought in contact with the substrate holder on a line having an equal distance from each of image pick-up devices of the two imaging devices.

According to the configuration, it is possible to restrain the occurrence of operation failure by the deviation of heat distribution in the stereo camera.

DETAILED DESCRIPTION OF EMBODIMENTS

Figure 1:
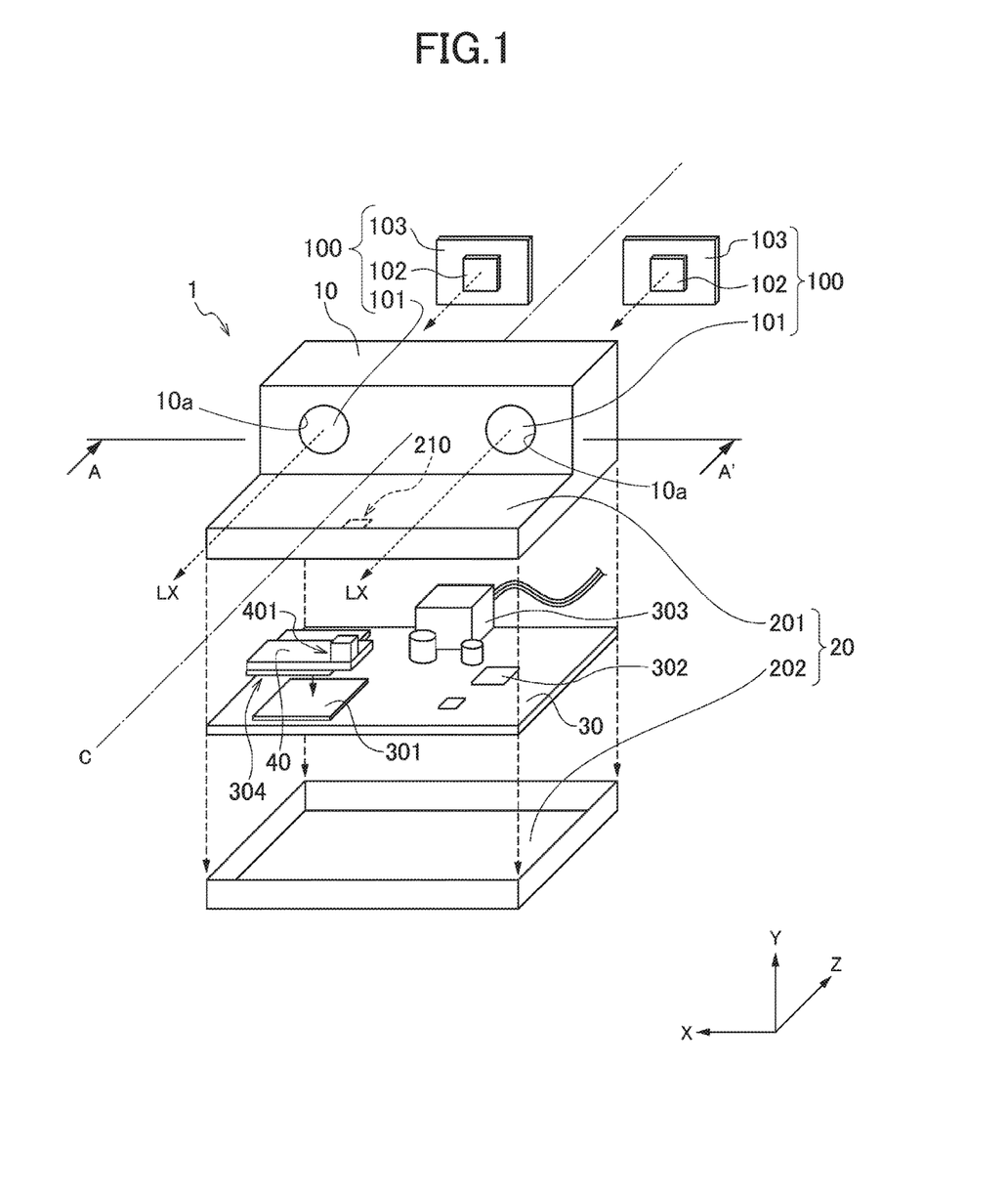
FIG. 1 is an exploded perspective view showing an outline of a stereo camera of one embodiment of an imaging unit according to the present invention.

Embodiments of the present invention will be described hereinafter with reference to the accompanying drawings. A first embodiment is first described. As illustrated in FIG. 1, a stereo camera 1 as an imaging unit includes a camera stay 10 which is an imaging device holder which holds two imaging devices 100 and a substrate holder 20 to which the camera stay 10 is fixed. Each of the two imaging devices 100 includes a lens 101, an image sensor 102, and a sensor substrate 103. Note that the camera stay 10 and the substrate holder 20 are integrally formed in the first embodiment.

Here, axes in a three-dimensional perpendicular coordinate system using when explaining a structure of the stereo camera 1 are defined as follows. As shown in FIG. 1, an X axis extends to a direction where the lenses 101 are arranged. A Z axis extends to a normal direction of a direction where each image sensor 102 images an image. A Y axis extends to a height direction of the stereo camera perpendicular to the X axis and the Z axis.

Each of the lenses 101 of the imaging devices is fitted in an opening 10a provided in a front portion of the camera stay 10. An optical axis Lx of each lens 101 has a standard length which is secured in a state where each lens is fitted in the opening and required for distance calculation. Moreover, the optical axis Lx of each lens 101 is held in a state parallel to the Z axis and directed to the same direction as the Z axis.

The image sensor 102 is disposed in a back surface side of each lens 101, that is, in the Z axis direction. The optical axis Lx of each lens 101 and a center of an imaging surface of each image sensor 102 are configured to coincide with each other. Each of the image sensors 102 is composed of an image pick-up device fixed to a separate sensor substrate 103. Each of the image sensors 102 outputs a signal regarding the subject imaged on the imaging surface through the corresponding lens 101.

In this case, the imaging device 100 is configured to fit the lenses 101 in the openings 10a of the front surface of the camera stay 10 and fix the image sensors 102 according to the optical axes Lx of the lenses 101. As a result, the imaging devices 100 detect a parallax quantity from images picked up by the two image sensors 102 and therefore a distance calculation can be achieved.

To correctly fix the two lenses 101 by the standard length which is one of important elements to correctly execute the distance calculation, the lenses 101 must be accurately maintained in a predetermined position and a predetermined arrangement. To do so, it is needed that, for example, an abutting surface of the camera stay 10 to each lens 101 is accurately worked and an abutting portion of each lens 101 to the camera stay 10 is accurately worked. Positions and dimensions of the holes to fit the lenses 101 in the camera stay 10 are correctly worked so as to accurately position the lenses 101. Note that it is preferable to use lenses having the same optical characteristic to fit to a focal length which is one of the important elements required for the distance calculation. In addition, regarding the image sensors 102 which influence a camera characteristic, it is preferable to use image sensors having the same optical characteristic.

To accurately execute the distance calculation, the parallelism of the optical axes Lx must be maintained. To maintain the parallelism, it is important to accurately work an abutment surface of the camera stay 10 to each lens 101 and an abutment surface of the lens 101 to the camera stay 10. In addition, the parallelism of the optical axes Lx of the two lenses 101 can be maintained even by accurately working the holes of the camera stay 10.

The substrate holder 20 includes an upper cover 201 and a lower cover 202. The camera stay 10 is fixed to the upper cover 201. Note that the upper cover 201 and the camera stay 10 may be integrally configured. The lower cover 202 has a concave shape in section as a tray.

The circuit substrate 30 is disposed and held in a space formed between the upper cover 201 and the lower cover 202 (see FIG. 1). Components relating to operation of the imaging device 100 such as calculation elements that calculate a distance based on control of operation of the imaging devices 100 and a parallax quantity between two images imaged by the imaging devices, and elements for controlling a light source are arranged on the circuit substrate 30. Heat-generating components generating a high temperature are included in these components. The heating component exemplified in FIG. 1 is a central processing unit (hereinafter referred to as CPU) 301. As shown in FIG. 1, a memory 302 used for the processing of the CPU 301, a power source section 303 that supplies an operation current to the CPU 301, and so on are arranged on the circuit substrate 30. Note that wirings (not shown) are provided between the circuit substrate 30 and each of the imaging devices 100.

In the following description, the CPU 301 only is described as the heating component in the stereo camera 1 according to the embodiment. It should be understood that the heating component is not limited to the CPU 301. For example, other components such as a field programmable gate array (FPGA), a power source-integrated circuit (IC), and so on correspond to the heat-generating components. When a plurality of heat-generating components is arranged on the circuit substrate 30, a heat transfer component 40 may be provided on each heating component (see FIGS. 1 and 2), as described below.

The heat-generating components mean components that release heat in surroundings during the operation. For example, the heating component such as the CPU 301 tends to generate abnormal operation due to thermal runaway when it cannot release heat. Therefore, a thermal interface material 304 (hereinafter referred to as TIM) to promote the heat release is attached to the CPU 301 (see FIG. 1).

The stereo camera 1 includes the heat transfer component 40 which is a heat transfer device to limit a heat transfer route from the CPU 301. The heat transfer component 40 is provided on an upper surface of the TIM 304 (see FIGS. 1 and 2). One end of the heat transfer component 40 is brought in contact with the TIM 304 to collect heat. A protrusion 401 is provided on the other end of the heat transfer component 40. The protrusion 401 is brought in contact with the upper cover 201 and is configured to limit the heat transfer route. Here, the heat transfer component 40 can be formed by a heat pipe, for example.

The TIM 304 is formed by a structure having high heat conductivity. In other words, it is preferable that a material of the TIM has high heat conductivity. For example, the TIM 304 is formed by working a heat pipe, graphite sheet, or thin steel plate. One surface, that is, a lower surface of the TIM 304 comes in contact with the CPU 301 to collect heat, and the other end, that is, the upper surface of the TIM 304 comes in contact with the heat transfer component 40 (see FIG. 2). Note that the one end of the heat transfer component 40 may be configured to come in contact with the CPU 301 directly. If the heat transfer component 40 is formed by the graphite, the fixation of the heat transfer component 40 to the CPU 301 can be performed by a double sided tape and so on.

As described above, the one end of the heat transfer component 40 is configured to come in contact with the TIM 304. The protrusion 401 provided on the other end of the heat transfer component 40 limits the heat transfer rout of heat and is configured to be in contact with the upper cover 201, as described above. A position of the upper cover 201, with which the protrusion 401 of the other end of the heat transfer component 40 comes in contact is a contact position 210 as shown in FIG. 1, for example. The contact position 210 is a position which is farthest from the two imaging devices 100 and has an equal distance from each of the two lenses 101 or the image sensors 102, in the upper cover 201.

Heat released from the CPU 301 is transferred to the contact position 210 of the upper cover 201 through the heat transfer component 40 in a state where the heat transfer route is limited. Thereby, heat inside the substrate holder 20 is transferred to the contact position 210 which is disposed in the predetermined position of the upper cover 201, and diffused throughout the entirety of the upper cover 201 from the contact position. Accordingly, even if the CPU 301 of the heat source is disposed in a deviated position on the entire stereo camera 1, it is possible to equalize heat distribution of the entirety of the stereo camera 1 by the heat transfer component 40 that limits the heat transfer route from the heat source of the deviated position.

Figure 2:
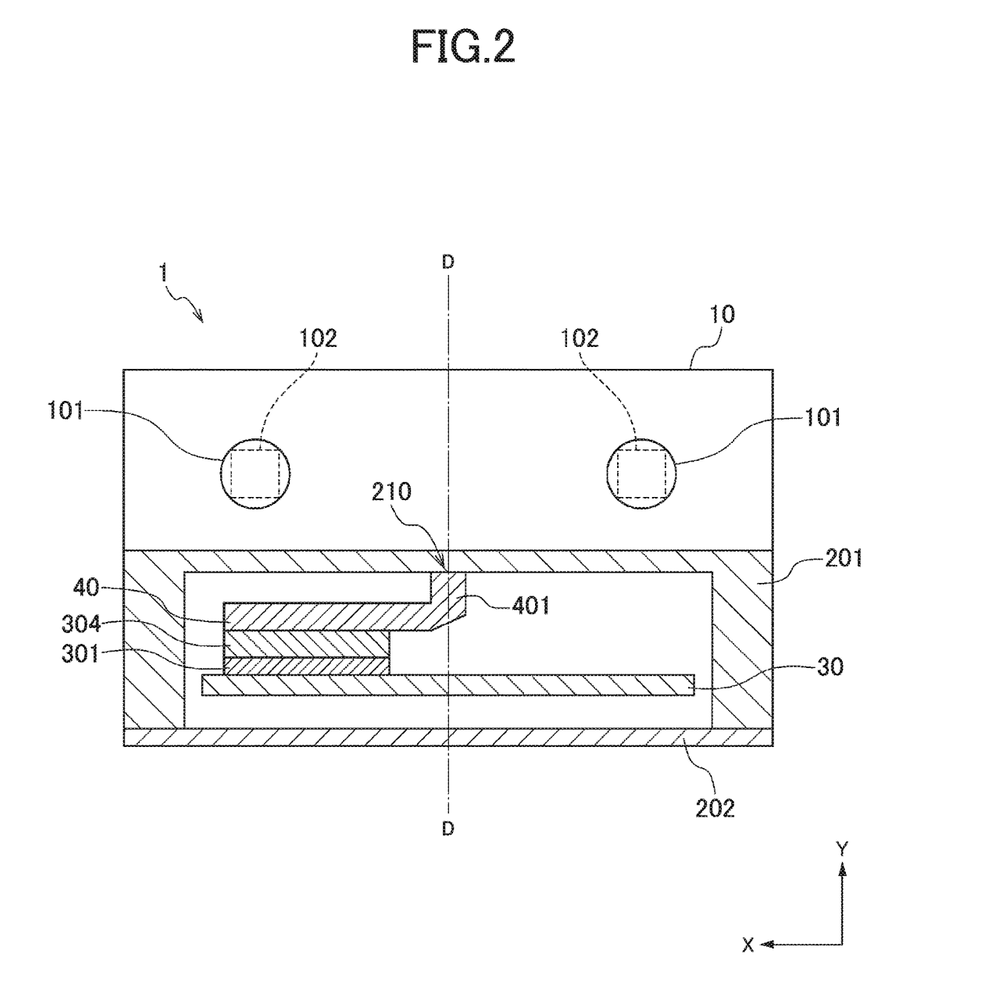
FIG. 2 is a partial sectional view taken along line A-A' of FIG. 1 showing one example of an inner structure of a main part of the imaging unit.

Next, a detailed structure regarding the stereo camera 1 is described. FIG. 2 is a sectional view taken along line A-A' of the stereo camera 1 shown in FIG. 1 and illustrates an inner structure of the substrate holder 20 which is a main characterizing part of the stereo camera 1.

As shown in FIG. 2, the TIM 304 is disposed on the CPU 301 disposed on an upper surface of the circuit substrate 30. The heat transfer component 40 is further disposed on the TIM 304.

The heat transfer component 40 is formed by a material having high heat conductivity. The one end of the heat transfer component 40 is configured to come in contact with the TIM 304 in a manner of surface contact. The protrusion 401 of the other end of the heat transfer component 40 is configured to come in contact with a position facing the contact position 210 on an inner side surface of the upper cover 201. The protrusion 401 of the heat transfer component 40 has a quadrangle such that an area of a contact portion between the protrusion 401 and the upper cover 201 becomes smaller than that of a contact portion between the protrusion 401 and the TIM 304. Accordingly, the heat from the heat source, that is, the CPU 301 concentrates at the protrusion 401. Note that the shape of the protrusion may be a column shape, triangle, or other polygonal columnar shape without being limited to the quadrangle as described above.

The contact position is disposed on a center line D of the stereo camera 1 (see FIG. 2). The center line D is a line which is on a Y-Z plane including a center axis C of the camera stay 10 shown in FIG. 1 and which passes through a middle point of a distance in the X axis direction of the two imaging devices 100 disposed on an X-Y plane. In other words, the center line D is a symmetrical axis when setting each of normal lines of image planes of the two image sensors 102 as a line symmetrical axis. That is to say, the center line D is a line which is in an equal distance from each of the image sensors 102. In other words, the center line D is parallel with a line perpendicular to each normal line of the image sensors 102 and passing through a middle point between the normal lines of the two image sensors 102. That is, the contact position 210 is disposed on a center of an axial symmetry in the image sensors 102 of the two imaging devices 100.

The contact position 210 is positioned on an end portion in front of the upper cover 201, as described above. In other words, the contact position 210 is in a position which is farthest from the two lenses 101 of the imaging devices of the stereo camera 1 and which is equally far from each of the two image sensors 102. In other words, the contact position 210 is located on a line of an equal distance from each of the two image sensors 102.

Generally, the CPU 301 is often disposed on a circumferential portion of the circuit substrate as shown in FIG. 2. If the heat transfer component 40 as described above is not used, the heat is released by being in contact the TIM 304 with the upper cover 201 just above a portion (hereinafter referred to as disposed portion) where the CPU 301 is disposed, or the heat is released from the upper cover 201 through a space between the upper cover 201 and the lower cover 202.

If do so, the heat is transferred from the upper cover 201 closest to the heat source, that is, the CPU 301 to the entirety of the stereo camera 1. Therefore, a portion of the upper cover 201 which is just above and close to the disposed portion of the CPU 301 has the highest temperature, and a heat distribution according to a distance from this portion having the highest temperature is formed. In this case, a heat distribution of the entirety of the stereo camera 1 becomes a state of deviating depending on a position of the CPU 301. As a result, if the heat transfer component 40 is not used, the heat distribution of the stereo camera 1 becomes uneven and a heat distribution of the camera stay 10 also becomes uneven.

When the heat distribution of the camera stay 10 becomes uneven, a temperature of each of the lens 101 and the image sensor 102 closer to the CPU 301 of the heat source than the other lens 101 and the image sensor 102, of the two lenses 101 and two image sensors 102, is higher than that of the other lens and image sensor.

If the camera stay 10 is made of a metal member, when the deviation of the heat distribution as described above exists, thermal expansion occurs in the stay depending on it. Therefore, the camera stay 10 is unevenly deformed. As a result, there is a possibility that a position of one of lenses 101 is deviated and the parallelism or alignment of the optical axes Lx cannot be correctly maintained.

When the position of the one of lenses 101 is deviated and the parallelism of the optical axes Lx cannot be correctly maintained, a view angle or focal position of each of the two images picked up by the two imaging devices 100 is not normal. Therefore, a distance to a subject cannot be calculated. In addition, when only one of the image sensors 102 becomes a high temperature, uniformity of characteristics of the two image sensors 102 is broken. Thereby, it is not possible to exactly calculate the distance. Furthermore, one of the image sensors 102 having a temperature higher than the other image sensor easily breaks in comparison to the other image sensor.

Therefore, by providing the heat transfer component 40 on the stereo camera 1, as described in the embodiment, even if the CPU 301 of the heat source is disposed on the circumferential portion of the circuit substrate 30, the heat transfer route is configured to integrate on a center portion between the two imaging devices 100. Thereby, a transfer position of heat is limited. As a result, it is possible to equalize the heat distribution of the entirety of the stereo camera 1.

In other words, a position of only one of the lenses 101 of the stereo camera 1 can be prevented from deviating from a correct position. In addition, it is possible to maintain the parallelism of the optical axes Lx of the lenses 101 and prevent the parallelism of the optical axes from deteriorating. Moreover, it is possible to prevent only one of the lenses from becoming a high temperature. As a result, it is possible to exclude a bad influence on calculation accuracy of the distance and to enhance reliability of the stereo camera 1 by preventing the lenses from being easily broken. Note that the heat transfer route may be configured to be substantially concentrated at the center portion between two imaging devices 100. However, in particular, it is prefer to concentrate the heat transfer route at a center portion between the image sensors 102 which easily receive influence of heat.

A method of transferring the heat of the stereo camera 1 described above is as follows. The camera stay 10 that holds the two imaging devices 100 is first fixed to the substrate holder 20 that holds the circuit substrate 30. Next, the one end of the heat transfer component 40 is brought in contact with the CPU 301 which is the heating component disposed on the circuit substrate 30. Thereafter, the other end of the heat transfer component 40 is brought in contact with the inner side surface of the substrate holder 20 at the contact position 210 that lies at the equal distance from each of the two image sensors 102. Thereby, the heat of the heating component disposed inside the stereo camera 1 is transferred to a predetermined position of the stereo camera 1.

Figure 3:
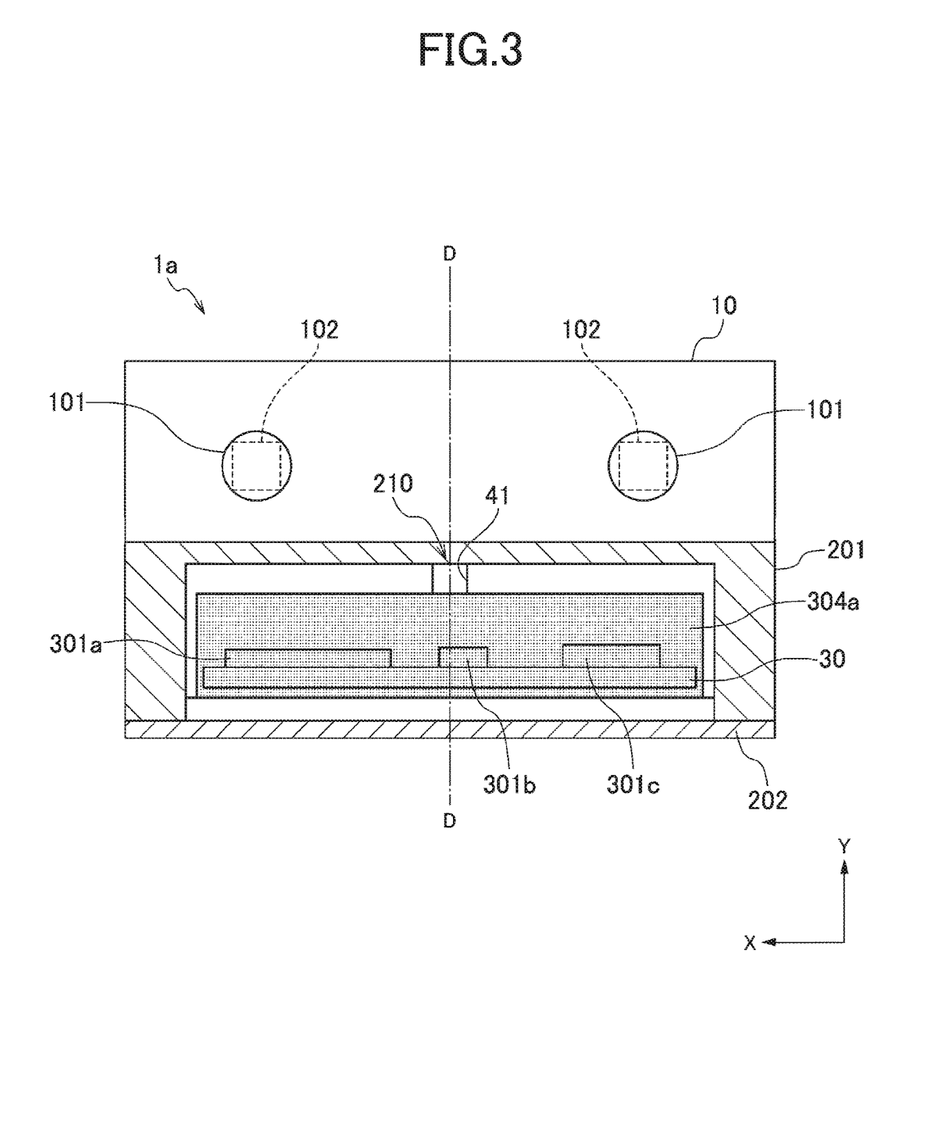
FIG. 3 is a partial sectional view taken along line A-A' of FIG. 1 showing other example of the inner structure of the main part of the imaging unit.

Next, a second embodiment of the imaging unit is described. FIG. 3 illustrates main characterizing portions of a stereo camera 1a according to the second embodiment and is a sectional view similar to FIG. 2.

The stereo camera 1a shown in FIG. 3 has a plurality of heat-generating components arranged on the circuit substrate 30. A CPU 301a, an FPGA 301b, and a power source IC 301c as the heat-generating components which are heat sources are arranged on the circuit substrate 30 of the stereo camera 1a. In addition, an interior space formed between the upper cover 201 and the lower cover 202 of the stereo camera 1a is filled with a filler 304a. The filler 304a is used instead of the TIM 304 in the first embodiment and promotes release of heat from the CPU 301a, the FPGA 301b, and the power source IC 301c.

One end of a heat transfer portion 41 as the heat transfer device is brought in contact with the filler 304a and the other end of the heat transfer portion 41 is brought in contact with a position corresponding to the contact position 210 of the upper cover 201 (see FIG. 3). The contact position 210 is disposed on the center line D of the stereo camera 1a. As described in the first embodiment, the center line D is a line which is on the Y-Z plane including the center axis C of the camera stay 10 shown in FIG. 1 and which passes through the middle point of the distance in the X axis direction of the two imaging devices 100 disposed on the X-Y plane. In other words, the center line D is a symmetrical axis when setting each of normal lines of image planes of the two image sensors 102 as a line symmetrical axis. That is to say, the contact position 210 is disposed in a position which is farthest from the two lenses 101 of the imaging devices 100 and is equally far from each of the two lenses 101 of the image sensors 102.

The stereo camera 1a is configured such that, even if the plurality of heat sources are randomly arranged, a route that transfers heat from each heat source, that is, a heat transfer route is limited and the heat from the heat sources is transferred to the contact position 210 which is disposed on the center line D of the stereo camera 1a and is equally far from each of the two lenses 101 of the image sensors 102. Thereby, heat distribution to the camera stay 10 is even, and heat transferred to the two lenses 101 and the two image sensors 102 is also even. Accordingly, the stereo camera is prevented the parallel relationship between the optical axes Lx of the lenses 101 from deteriorating and variation in characteristics of the image sensors 102 can be reduced. As a result, the stereo camera 1a can exactly execute the calculation of the distance.

Figure 4:
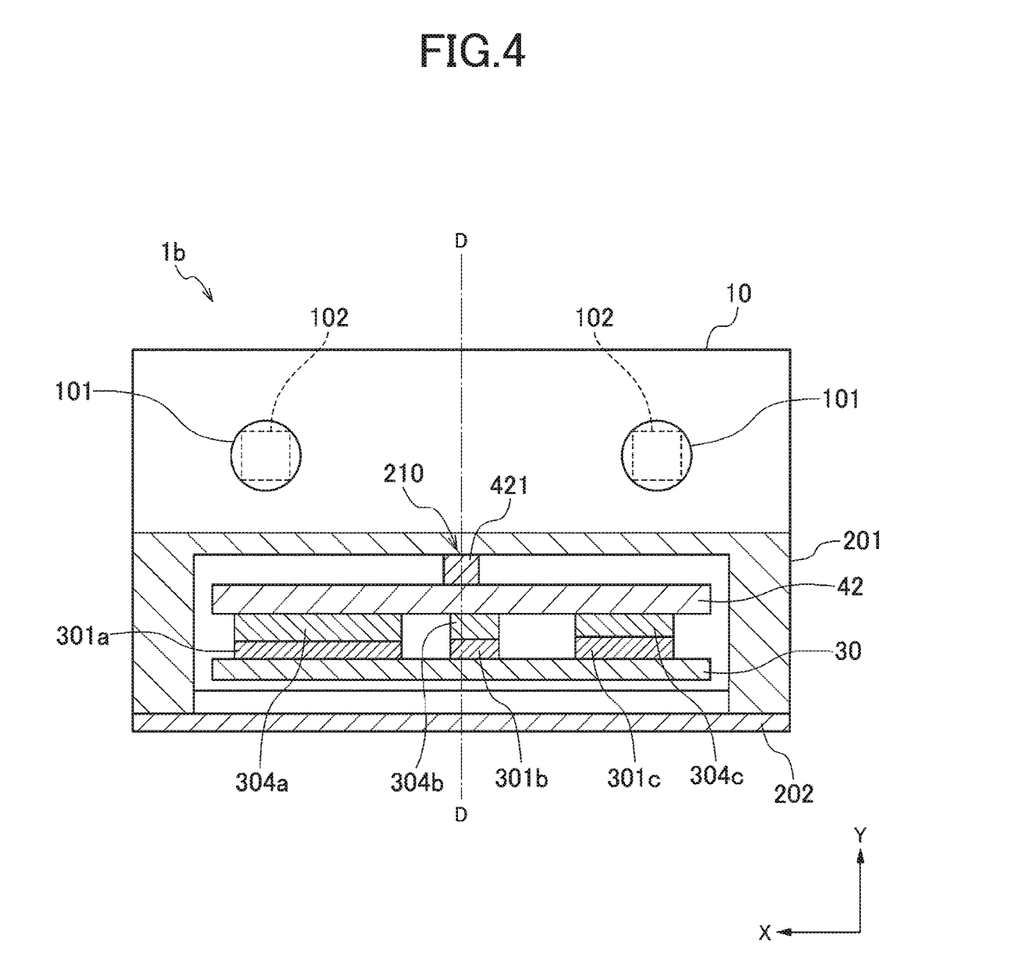
FIG. 4 is a partial sectional view taken along line A-A' of FIG. 1 showing further other example of the inner structure of the main part of the imaging unit.

Next, a third embodiment of the imaging unit is described. FIG. 4 illustrates main characterizing portions of a stereo camera 1b according to the third embodiment and is a sectional view similar to FIG. 2.

As shown in FIG. 4, the stereo camera 1b includes a plurality of heat sources. The CPU 301a, the FPGA 301b, and the power source IC 301c as the heat sources are arranged on the circuit substrate 30. A first TIM 304a, a second TIM 304b, and a third TIM 304c as thermal interface materials are attached to the CPU 301a, the FPGA 301b, and the power source IC 301c as the heat sources, respectively to promote release of heat from the heat sources A heat transfer component 42 as a heat transfer device includes a plate-shaped portion having a flat surface and a projection 421 provided on a center portion of an upper surface of the plate-shaped portion to have a projecting shape in section. A lower surface of the heat transfer component 42 is brought in contact with all of the heat sources and the thermal interface materials. On the other hand, an upper surface of the projection 421 of the heat transfer component 42 is brought in contact with a position corresponding to the contact position 210. The contact position 210 is disposed on the center line D of the stereo camera 1a. Here, the center line D is in the same position as the center lines D in the stereo cameras 1 and so on according to the first and second embodiments as described above. Accordingly, the contact position 210 is disposed in a position which has an equal distance and is farthest from the two lenses 101 and the image sensors 102.

Heat from the CPU 301a, the FPGA 301b, and the power source IC 301c is transferred to the heat transfer component 42 through the first TIM 304a, the second TIM 304b, and the third TIM 304c. Heat transferred to the heat transfer component 42 is transferred to a position of the upper cover 201 corresponding to the contact position 210 through the limitation of the heat transfer route by the projection 421.

In the stereo camera 1b, even if the plurality of heat sources are randomly arranged, the heat released from each heat source is collected from the plate-shaped portion of the heat transfer component 42 to the projection 421 and is limited to be transferred from the projection 421 to the contact position 210. Thereby, the heat distribution of the entirety of the stereo camera 1b becomes even.

If that is done, because the heat distribution to the camera stay 10 becomes also even, heat transferred to the two lenses 101 and the two image sensors 102 becomes also even.

Therefore, it is possible to prevent the deterioration of the parallel relationship between the optical axes Lx of the lenses 101 due to the heat and reduce the variation in the characteristics of the image sensors 102 due to the heat. Thereby, the stereo camera 1b can exactly execute the calculation of the distance.

Figure 5:
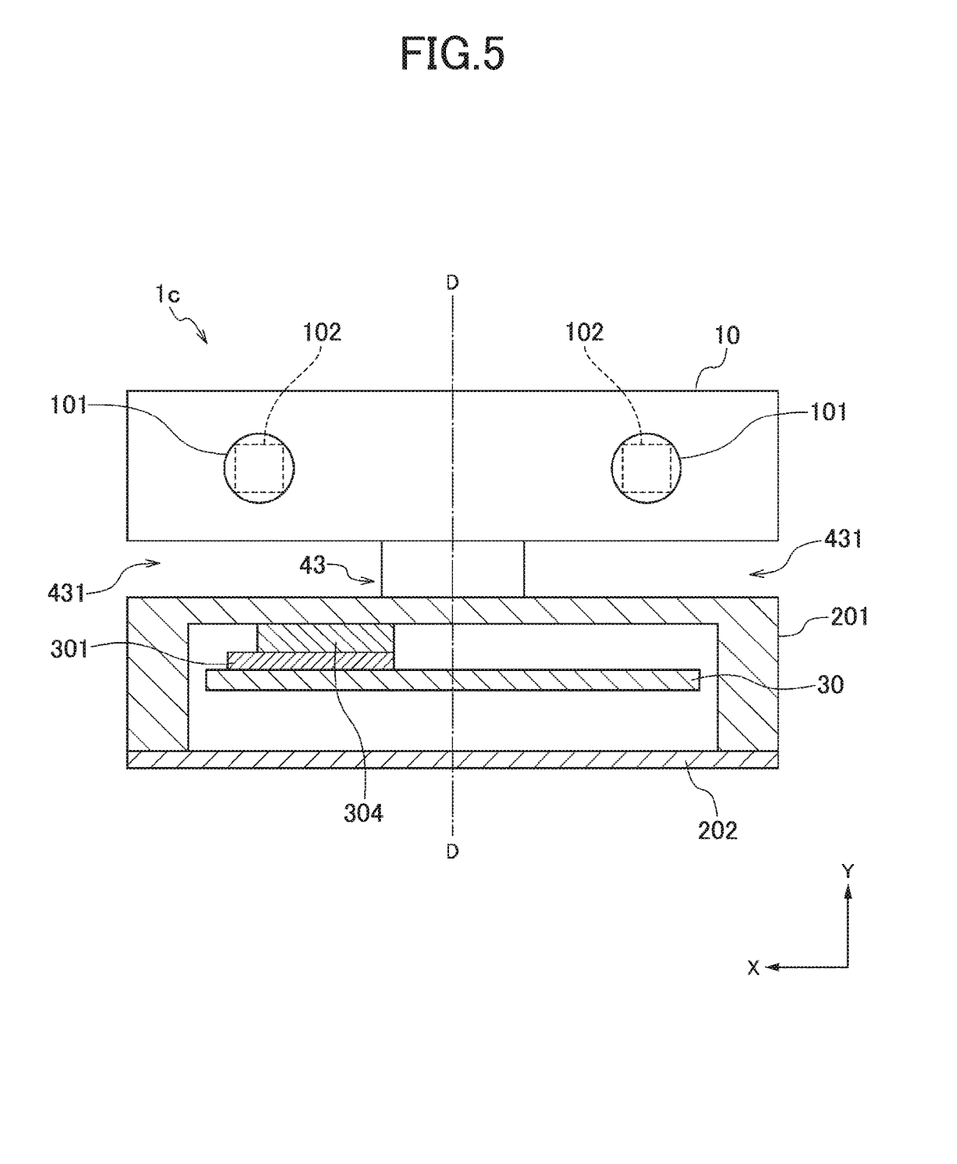
FIG. 5 is a partial sectional view taken along line A-A' of FIG. 1 showing still other example of the inner structure of the main part of the imaging unit.

Next, a fourth embodiment of the imaging device is described. FIG. 5 illustrates main characterizing portions of a stereo camera 1c according to the fourth embodiment and is a sectional view similar to FIG. 2.

As shown in FIG. 5, in the stereo camera 1c according to the fourth embodiment, the camera stay 10 and the upper cover 201 are separated. The camera stay 10 and the upper cover 201 are connected through a connector 43. In the stereo camera 1c according to the fourth embodiment, a heat transfer device is formed by the connector 43 and the upper cover 201. A space 431 corresponding to a height of the connector 43 is provided between the upper cover 201 and the camera stay 10 by the connector 43.

The connector 43 is disposed at a center in a width direction of the camera stay 10 and the upper cover 201, if the width direction is an arranged direction of the lenses 101. The center in the width direction is on the same axis as the center of the camera stay 10 and the upper cover 201. Note that a dimension of the connector 43 in the width direction is equal to half or less than half of a width dimension of the camera stay 10 or the upper cover 201.

In the stereo camera 1c, the CPU 301 of the heat source is brought in contact with the upper cover 201 through the TIM 304 of the thermal interface material. A part of heat transferred from the CPU 301 to the upper cover 201 is released out of the stereo camera 1c passing through the space 431.

Here, a heat transfer route of a part of the heat from the CPU 301 is limited by the connector 43. The connector 43 is disposed on a center line D of the stereo camera 1c. Note that the center line D is on the same position as the center line D of the stereo camera 1 and so on, in the first to third embodiments as described above. Accordingly, even in the fourth embodiment, the contact position 210 is in a position which has an equal distance and is farthest from the two lenses 101 and the two image sensors 102. Here, for example, the connector 43 is positioned at a central portion of the upper cover 201.

As in the stereo camera 1c, even if the CPU 301 of the heat source is disposed on a circumferential portion of the circuit substrate 30, the heat from the CPU 301 is transferred to the camera stay 10 through the connector 43. In other words, the heat from the CPU 301 is evenly transferred to the two lenses 101 and the two image sensors 102 through the connector 43. Therefore, it is possible to prevent the deterioration of the parallel relationship between the optical axes Lx of the lenses 101 due to the heat and reduce the variation in the characteristics of the image sensors 102 by the heat. As a result, the stereo camera 1c can exactly execute the calculation of the distance.

As described above, in each embodiment, because the deviation of the heat transferred to the camera stay 10 is not generated, a heat distribution to the lenses 101 composed of two monocular lenses and the image sensors 102 becomes also even. Thereby, it is possible to prevent a relative position of the lenses 101 from being changed depending on time and maintain the parallelism of the optical axes Lx. In addition, the deviation of the heat in the image sensors 102 is not generated and the characteristics of the image sensors are not changed even by a change on standing due to the heat. Thereby, it is possible to eliminate a variation difference between two images as imaged and can exactly execute distance calculation by a parallax quantity between the two images.

Figure 6:
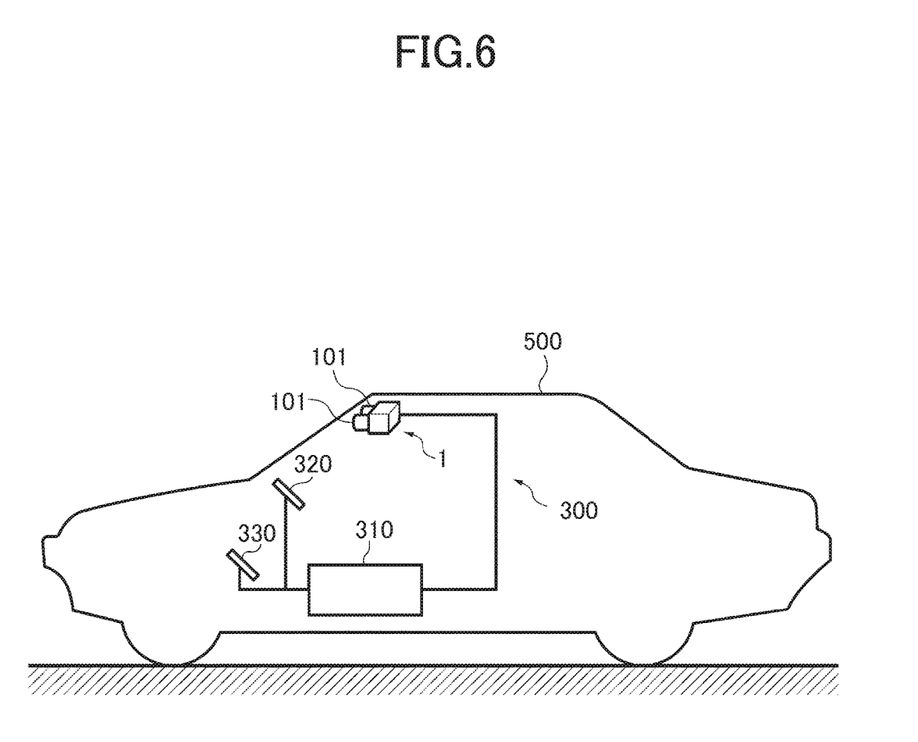
FIG. 6 is a schematic diagram showing one embodiment of a vehicle control unit according to the present invention.

Next, a vehicle control unit according to an embodiment of the present invention is described. The vehicle control unit is mounted on a vehicle, and calculates a distance to an object existing in a travelling direction of the vehicle and controls movement of the vehicle in accordance with the distance, by use of one of the stereo cameras 1a to 1c as described above.

As shown in FIG. 6, the lenses 101 of the stereo camera 1 are provided on the vehicle 500 to be capable of photographing a scene in front of the vehicle 500 in the traveling direction. The stereo camera 1 is mounted close to an inner rear view mirror of an inner upper portion (vehicle interior side) of a windshield of the vehicle 500. A mounted position of the stereo camera 1 is not limited to the above-mentioned position and may be mounted at a position capable of detecting circumstances outside the vehicle in front of the vehicle 500 in the traveling direction.

The stereo camera 1 may be mounted on an object where a distance to a target to be measured changes. The stereo camera 1 is not limited to the use for the vehicle 500 and can be mounted on moving bodies such as ships, trains, or fixing bodies such as building in a case of being used for factory automation (FA). The stereo camera 1 obtains a distance to a subject (measured object) to be photographed from image data including the photographed subject (acquiring distance information). The measured object of the stereo camera 1 corresponds to other moving body, a person(s), an animal(s) and so on.

The vehicle control unit 300 includes the stereo camera 1 provided in the vehicle interior which is a room space, a control device 310, a steering wheel 320, and a brake pedal 330, as shown in FIG. 6. The stereo camera 1 has a function of photographing the travelling direction of the vehicle 500 and is disposed close to the rear view mirror provided above the windshield of the vehicle 500, for example.

Here, a relationship between the stereo camera 1 and the vehicle control unit 300 is described. The control device 310 of the vehicle control unit 300 executes various vehicle controls by the distance information from the stereo camera 1 to the subject, acquired based on the parallax image received from the stereo camera 1.

The control device 310 executes steering control to avoid an obstacle by controlling a steering system (controlled object) including the steering wheel 320 based on the parallax image received from the stereo camera 1, as an example of the vehicle controls. In addition, the control device 310 executes brake control and so on causing the vehicle 500 to decelerate and stop by controlling the brake pedal 330 (controlled object) based on the parallax image received from the stereo camera 1. With such a stereo camera 1 and a vehicle control unit 300 including the control device 310, the vehicle control such as the steering control or the break control is executed, and hence safety of driving of the vehicle 500 can be improved.

As described above, the stereo camera 1 is configured to photograph the front of the vehicle 500, but is not limited to this. For example, the stereo camera 1 may be disposed to photograph a rear or side of the vehicle 500. In this case, the stereo camera 1 can detect a position of a following vehicle in the rear of the vehicle 500 or other vehicle travelling parallel to the side of the vehicle 500. The control device 310 can execute the above-mentioned vehicle control by detecting a risk when changing in a vehicle lane or entering a merging lane of the vehicle 500.

In addition, the control device 310 can execute the above-mentioned vehicle control in a case where it is determined to have a risk that the vehicle 500 collides with an obstacle which exists in rear of the vehicle 500 and is detected by the stereo camera 1 in the back movement of the vehicle 500 at the time of parking the vehicle 500, based on parallax image of the obstacle.

As described above, the stereo camera 1 inter-connecting with the vehicle control unit 300 is disposed in a position of the vehicle 500 where easily gets direct sunlight and so on. The entirety of the stereo camera 1 is irradiated with the direct sunlight and so on. Therefore, the deviation of the heat distribution of the stereo camera does not occur, differing from the heat from the particular components on the circuit substrate 30.

From the above description, the vehicle control unit 300 can prevent the heat distribution to the camera stay 10 from becoming uneven by the heat from the heat-generating components inside the stereo camera 1, by the effects of the heat transfer component 40 of the heat transfer device and so on. Thereby, the heat distribution of the camera stay 10 becomes even and therefore the distance can be accurately calculated. As a result, the vehicle control unit 300 can more exactly execute the control of the vehicle 500.

Although the present invention has been described in terms of exemplary embodiments, it is not limited thereto. It should be appreciated that variations may be made in the embodiments described by persons skilled in the art without departing from the scope of the present invention as defined by the following claims.

What is claimed is:

1. An imaging apparatus, comprising:
   two imaging devices;
   an imaging device holder that holds the two imaging devices;
   a substrate holder that holds a circuit substrate on which a component regarding operation of the two imaging devices is disposed, wherein the substrate holder has an upper cover and a lower cover, the upper cover being closer to the two imaging devices than the lower cover, and the component is located away from a plane that is an equal distance from each of image pick-up devices of the two imaging devices; and
   a heat transfer device that transfers heat generated in the component to the substrate holder and to the imaging device holder to equalize heat distribution in an entirety of the imaging apparatus,
   wherein one end of the heat transfer device contacts the component, and an other end of the heat transfer device contacts the upper cover of the substrate holder on the plane.

2. The imaging apparatus according to claim 1, wherein the other end of the heat transfer device contacts an end portion of the substrate holder remote from the imaging devices.

3. The imaging apparatus according to claim 1, wherein the heat transfer device is formed by a heat pipe.

4. The imaging apparatus according to claim 1, wherein an imaging device holder that holds the two imaging devices and the substrate holder are connected by a connector, and the connector is positioned at a center portion of the imaging device holder.

5. The imaging apparatus according to claim 4, wherein a space corresponding to a height of the connector is provided between the imaging device holder and the substrate holder.

6. The imaging apparatus according to claim 4, wherein the connector has a width that is equal to half or less than half of that of the imaging device holder or the substrate holder.

7. A vehicle control unit, comprising:
   the imaging apparatus of claim 1, wherein the imaging apparatus is mounted on a vehicle and calculates a distance to an object existing in a travelling direction of the vehicle.

8. A heat transfer method for an imaging apparatus configured to transfer heat of a component regarding operation of the imaging apparatus having two imaging devices and an imaging device holder that holds the two imaging devices, the method comprising:
   providing a substrate holder that holds a circuit substrate on which a component regarding operation of the two imaging devices is disposed, wherein the substrate holder has an upper cover and a lower cover, the upper cover being closer to the two imaging devices than the lower cover, and the component is located away from a plane that is an equal distance from each of image pick-up devices of the two imaging devices;
   providing a heat transfer device that transfers heat generated in the component to the substrate holder and to the image device holder to equalize heat distribution in an entirety of the imaging apparatus;
   contacting one end of a heat transfer device that transfers the heat to a substrate holder that holds a circuit substrate on which the component is disposed with the component; and
   contacting an other end of the heat transfer device with an inner side of the upper cover of the substrate holder existing on the plane to transfer the heat from the other end of the heat transfer device to the two image pick-up devices on the plane.

9. The imaging apparatus of claim 1, further comprising a thermal interface layer disposed between the component and the heat transfer device.

10. The imaging apparatus of claim 1, wherein each of the two imaging devices includes a lens, each having an optical axis extending in a same predetermined direction, and
    the other end of the heat transfer device contacts the upper cover at a contact position that lies on the plane and is farthest from the lens in the predetermined direction.

11. The imaging apparatus of claim 1, wherein
    the imaging device holder is formed by a metal member, and
    the substrate holder is formed by a metal member.

* * * * *